United States Patent [19]

Colineau et al.

[11] 4,438,375

[45] Mar. 20, 1984

[54] ELECTRIC CIRCUIT FOR CONVERTING AN AC VOLTAGE INTO A DC VOLTAGE OR A VOLTAGE VARIABLE AT A LOWER FREQUENCY

[75] Inventors: Joseph Colineau; Jean Y. Mahéo, both of Paris, France

[73] Assignee: Thomson-Brandt, Paris, France

[21] Appl. No.: 221,799

[22] Filed: Dec. 31, 1980

[30] Foreign Application Priority Data

Jan. 8, 1980 [FR] France ................................ 80 00307

[51] Int. Cl.³ ........................ H01J 29/70; H01J 29/76
[52] U.S. Cl. .................................................... 315/408
[58] Field of Search ................................ 315/399, 408

[56] References Cited

U.S. PATENT DOCUMENTS

| 3,870,903 | 3/1975 | Taylor . | |
| 3,956,668 | 5/1976 | Ogawara | 315/408 |
| 4,322,663 | 3/1982 | Rilly | 315/408 |
| 4,331,908 | 5/1982 | Rilly | 315/411 |

FOREIGN PATENT DOCUMENTS

| 2262442 | of 0000 | France . |
| 2318545 | of 0000 | France . |
| 2432251 | of 0000 | France . |
| 1214313 | of 0000 | United Kingdom . |

OTHER PUBLICATIONS

Funkschau, vol. 42, No. 18, Sep. 1970, Munich (DE) E. Richter, "Netzgerat mit Thyristor", p. 1840.

*Primary Examiner*—Theodore M. Blum
*Attorney, Agent, or Firm*—Roland Plottel

[57] ABSTRACT

The circuit comprise a switch controlled so that at each period of the AC voltage it is conducting for a period of time which depends on the desired output voltage, and a control of the output voltage slaved to an instruction or reference signal. The measuring signal of the control is the mean value of the voltage at the terminals of said switch during a period of the AC voltage. For establishing the mean value there is provided, an integrator whose input receives the voltage signal at the terminals of the controlled switch.

19 Claims, 5 Drawing Figures

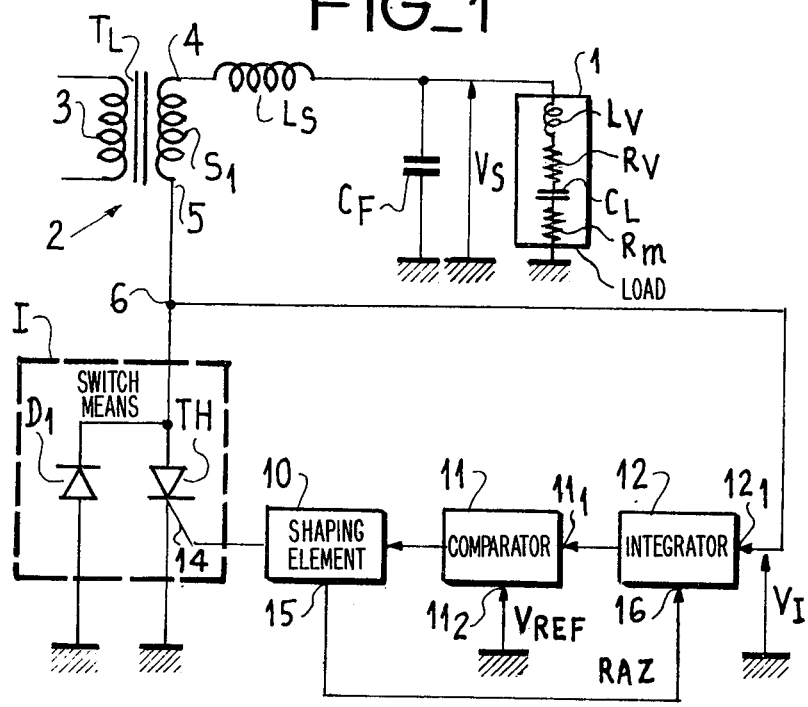
FIG_1
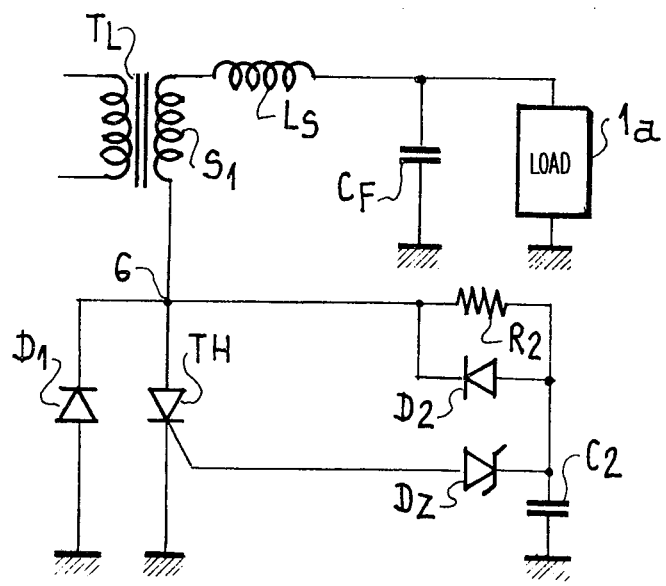
FIG_2

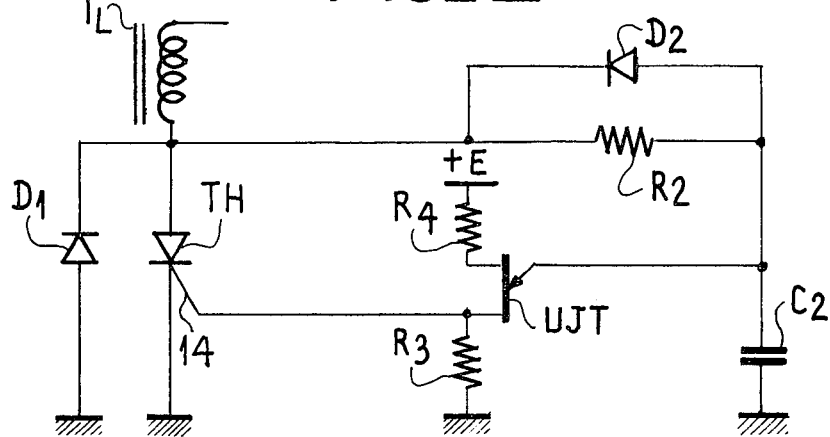
FIG_3
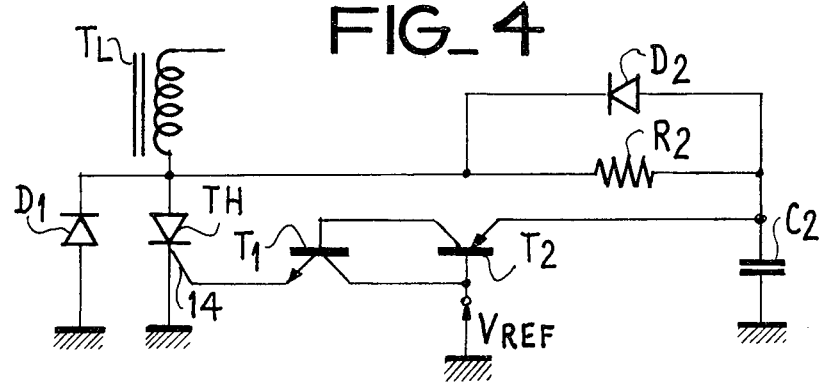
FIG_4
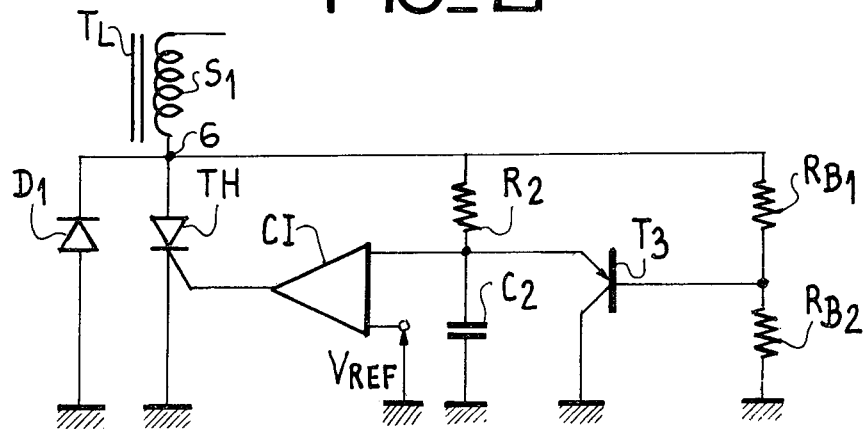
FIG_5

ELECTRIC CIRCUIT FOR CONVERTING AN AC VOLTAGE INTO A DC VOLTAGE OR A VOLTAGE VARIABLE AT A LOWER FREQUENCY

BACKGROUND OF THE INVENTION

The invention relates to a circuit for converting an AC voltage into a variable voltage at a lower frequency which comprises a switch controlled so that at each period of the AC voltage it is conducting for a period which depends on the desired output voltage, a feedback loop being provided to bring the output voltage under the control of an instruction or reference signal.

Such a conversion circuit, called switched-mode circuit or chopped power supply, only consumes just the energy required for supplying a load using the output voltage. This is why it can lend itself to numerous applications.

Such a circuit has been described in the copending U.S. patent application No. 58,978 the circuit of this application forms an auxiliary power supply for a television receiver, the AC voltage being a voltage at the horizontal scan frequency and the output voltage a DC voltage.

In copending U.S. patent application No. 52,982 there is described another circuit of this type in which the output voltage is used for supplying the vertical deflector coil of a television receiver, the AC input voltage also being a voltage at the horizontal scan frequency.

The invention covers the same field of application but is however not limited thereto. It relates, generally, to voltage power supplies, for example for motors or for forming audio-frequency amplifiers or, in television, for forming a circuit for correcting the east-west cushion distortion.

The invention arises from the realization that in the circuits of the earlier above-mentioned patent applications the response time of the control means to a disturbance could be too long for certain applications. In fact, the lower limit of the response time is determined by the filtering means forming part of the conversion circuit for the measuring signal of the control means is the output voltage of the circuit which, of course, appears downstream of these filtering means whereas the feedback loop acts on the control electrode of the switch which is upstream of the filtering means.

SUMMARY OF THE INVENTION

The invention ensures, on the contrary, a rapid response of the control means to a disturbance.

The circuit of the invention is characterized in that the measuring signal of the control means is the mean voltage, over a period of the input signal, at the terminals of the controlled switch. In fact this mean voltage represents the output voltage and may then be used for constituting the measuring signal of the control means. The response time of this control means to a disturbance is at most of the order of a period of the input signal whereas in the circuits of the earlier patent applications this response time is of the order of a period of the output signal. Furthermore, the circuit of the invention is particularly simple in construction.

DESCRIPTION OF THE DRAWINGS

Other features and advantages of the invention will appear from the description of certain embodiments, with reference to the accompanying drawings in which:

FIG. 1 is a vertical-scan circuit diagram in accordance with the invention, and

FIGS. 2 to 5 are variations of FIG. 1.

DESCRIPTION OF THE PREFERRED EMBODIMENTS

The vertical scanning circuit (FIG. 1) comprises a vertical deflection coil represented here by an inductance $L_V$ in series with a resistor $R_v$, this coil being itself in series with a connecting capacitor $C_L$ and a measuring resistor $R_m$. This series assembly $L_V$, $R_V$, $C_L$ and $R_m$ constitutes a load 1 connected to the output terminal of a chopped power supply 2 which draws its energy from the line return pulses, i.e. from the overvoltage appearing at the terminals of the horizontal deflection coil (not shown) during horizontal scan return periods.

These line return pulses are applied to the terminals of the primary winding 3 of a transformer $T_L$ and are collected at the terminal of a secondary winding $S_1$ of this transformer supplying, on the one hand, filtering means with inductance $L_S$ (not coupled to the transformer) and filtering capacitor $C_F$ and, on the other hand, a controlled switch I formed here by a thyristor TH in parallel, but in reverse direction, with a diode $D_1$.

The circuit is such that a terminal of inductance $L_S$ is connected directly to a first terminal 4 of winding $S_1$, the other terminal of the inductance being connected to ground through capacitor $C_F$. The second terminal 5 of winding $S_1$ is connected to the anode of thyristor TH whose cathode is grounded, the anode of diode $D_1$ being thus also grounded.

Load 1 is connected to the terminals of capacitor $C_F$.

In accordance with the invention, the voltage $V_1$ at the terminals of switch I is applied to the input $12_1$ of an integrator 12 through a connection from terminal 6 common to winding $S_1$ and to this switch I. The output of this integrator is connected to the first input $11_1$ of a comparator whose second input $11_2$ receives an instruction signal $V_{REF}$ representing the voltage desired at the terminals of load 1. This signal is supplied by a vertical-scan oscillator or "frame oscillator" (not shown) generating signals substantially in the shape of sawteeth at the vertical-scan frequency. The output of comparator 11 is connected to the gate 14 of thyristor TH through a shaping element 10 having a terminal 15 connected to a reset input 16 RAZ of integrator 12 at each scanning period of a line.

The mean value $V_1$ over a period of the line scan signal of the voltage at the terminals of switch I is equal to the mean value, over this same period, of the output voltage $V_S$ for the respective mean values of the voltages at the terminals of winding $S_1$ and at the terminals of winding $L_S$ are zero.

Thyristor TH becomes conducting when the level of the output signal of integrator 12 reaches the level of the reference signal $V_{REF}$. The output voltage $V_S$ is thus the image of the instruction voltage $V_{REF}$.

So that integration takes place under the same conditions at each period of the input signal, the integrator is reset by means of circuit 10 at each period of said input signal, i.e. at each horizontal scan period.

In the embodiment shown in FIG. 1, the integration and comparison are effected in analog form. As a variation, these functions are effected digitally.

As a further variation, the voltage $V_{REF}$ instead of being variable is a DC voltage, the output voltage then being equal to a DC voltage $V_S$, which allows the circuit to be used as an auxiliary supply in a television receiver.

Voltage $V_S$ is independent of the shape, the amplitude and the frequency of the input signal as long as the frequency of this signal is high with respect to the frequency of the instruction signal $V_{REF}$.

The circuit is self-protected and its output impedance is low.

Finally, as has already been mentioned, the control is very rapid, its response time being of the order of a line scan signal period.

The circuit shown in FIG. 2 is intended to generate a DC voltage at the terminals of load $1_a$.

The integrator comprises a resistor $R_2$ in series with a capacitor $C_2$ one of whose plates is grounded.

A diode $D_2$ is in parallel across resistor $R_2$, its anode being connected to the junction point between resistor $R_2$ and capacitor $C_2$ and its cathode being connected to terminal 6. This diode $D_2$ allows discharge of capacitor $C_2$ when thyristor TH is conducting and thus resetting of the integrator.

The gate of thyristor TH is connected to the anode of a Zener diode $D_Z$ whose cathode is connected to the resistor $R_2$-capacitor $C_2$ junction point. This Zener diode constitutes both comparator 11 and the generator of the reference voltage $V_{REF}$.

When the voltage at the terminals of capacitor $C_2$ exceeds the Zener voltage of diode $D_Z$, a current flows in this diode, which causes thyristor TH to become conducting. The Zener voltage determines then the triggering time of the thyristor at each period of the input signal and so the level of the output signal.

As a variation, in place of a Zener diode $D_Z$ a diac (not shown) may be used.

The circuit shown in FIG. 2 does not require an external power supply and may be constructed in the form of a monolithic or hybrid integrated circuit and is then in the form of a dipole.

From a single source of periodic signals, i.e. from a single winding $S_1$, several voltages may be obtained by using several dipoles of this type, each being associated with a filtering cell $L_S$, $C_F$ and with a load 1.

In the embodiment shown in FIG. 3, in place of a Zener diode $D_Z$, a double-base transistor UJT is used biased through resistors $R_3$ and $R_4$ by a DC supply voltage +E forming the reference source or instruction source.

The emitter of the double-base transistor is connected to the common point between resistor $R_2$ and capacitor $C_2$, its first base is connected to the gate 14 of thyristor TH and to ground through resistor $R_3$, and its second base is connected to the reference source +E through resistor $R_4$.

This embodiment has the advantage of allowing the injection of considerable energy on the gate of thyristor 14 at the time of triggering thereof. As in the case of FIG. 2, the triggering time of the active switch and so the DC output voltage may be varied by varying the value of resistor $R_2$ and/or the capacity of capacitor $C_2$. A variable resistor and/or a variable-capacity capacitor may then be used. It is however preferable to limit the variations of these values so that the product of the value of resistor $R_2$ and the capacity of capacitor $C_2$ remains large with respect to the period of the input signal, so that the signal supplied by the integrator varies linearly depending on the time.

The example of FIG. 4 is more specially adapted to the construction of a circuit generating a variable voltage. In this circuit there is provided, in place of Zener diode $D_Z$ or double-base transistor UJT, two transistors $T_1$ and $T_2$. Transistor $T_1$ is NPN type with its emitter connected to the gate 14 of thyristor TH, its collector connected to the base of transistor $T_2$ and its base connected to the collector of the same transistor $T_2$. This latter is of PNP type with its emitter connected to the common point between resistor $R_2$ and capacitor $C_2$. The reference voltage $V_{REF}$ is applied to the base of transistor $T_2$.

The assembly formed by the two transistors $T_1$ and $T_2$ compares th voltage at the terminals of capacitor $C_2$ with the reference voltage $V_{REF}$. These two transistors are enabled as soon as these voltages are equal. The $V_{REF}$ voltage is for example, as in the case of FIG. 1, a signal substantially in the shape of sawteeth at the vertical-scan frequency, load 1 then being the same as that shown in FIG. 1.

In the example of FIG. 5, the integrator comprises also a resistor $R_2$ and a capacitor $C_2$. But in place of diode $D_2$ there is provided a transistor $T_3$ of PNP type whose emitter is connected to the common point between resistor $R_2$ and capcitor $C_2$ and whose collector is connected to ground. The base of this transistor $T_3$ is connected to the common point 6 between the anode of thyristor TH and winding $S_1$ of the line transformer $T_L$ through a resistor $R_{B1}$. This base is also connected to ground through another resistor $R_{B2}$.

The comparator is an integrated circuit CI whose output is connected directly to the gate of thyristor TH.

The output signal of comparator CI changes level when the voltage at the terminals of capacitor $C_2$ reaches the reference voltage $V_{REF}$, which causes thyristor TH to conduct. The voltage at the terminals of the switch then becomes zero and transistor $T_3$ becomes conducting, which causes the discharge of capacitor $C_2$. The voltage at the terminals of capacitor $C_2$ remains zero as long as the switch is closed, i.e. as long as the thyristor is conducting.

The reference voltage $V_{REF}$ is, as in the case of FIG. 4, either a variable voltage or a constant voltage.

Whatever the embodiment, the circuit allows energy in the form of an AC signal, delivered by a generator or tapped from a transformer winding, to be transformed into energy having a DC form or variable at a lower frequency.

What is claimed is:

1. An electrical circuit for converting an ac voltage applied to an input (S1) to a dc voltage (Vs) variable at a lower frequency at an output (1), comprising
   (a) a filter (LS,CF) connected between said input and output;
   (b) switch means (I) having an output (6) connected in series with said input, said filter, and said circuit output and on that side of the filter which is connected to said input, for conducting during each cycle of the ac voltage for a period of time in accordance with the desired dc output voltage;
   (c) means for receiving a reference signal (112,VREF) proportional to the desired dc output voltage; and (d) control means (11,12) connected to said switch means (I) for operating said switch means and thus controlling the output dc voltage (VS), having an input (at 112) for receiving said reference signal (VREF), and an input (121) connected to said switch means (I);

said control means including means for establishing (12) a mean value of a voltage at said switch means output (6) during a cycle of input ac voltage, and including an output (to 14) connected to said switch means for operating said switch means, said control means operating said switch means in accordance with and slaved to instructions from said reference signal and proportional to a mean value of said voltage at said switch means output (6).

2. The circuit as claimed in claim 1, wherein there is provided, for establishing the mean value, an integrator whose input receives the voltage signal at the terminals of the switch means.

3. The circuit as claimed in claim 2, wherein there is further provided a comparator for comparing the output signal of the integrator with the reference signal and for operating said switch depending on the result of the comparison.

4. The circuit as claimed in claim 2 or 3, wherein the integrator is reset at each period of the AC voltage.

5. The circuit as claimed in claim 3, wherein the integrator is reset at each period of the AC voltage and wherein the output of said comparator is connected to a control electrode of said switch through a shaping circuit and also having an output connected to a reset input of said integrator.

6. The circuit as claimed in claim 2, wherein said integrator comprises a resistor in series with a capacitor, the mean value output signal of said integrator being formed by the voltage at the terminals of said capacitor.

7. The circuit as claimed in claim 6, wherein the integrator is reset at each period of the AC voltage and wherein a diode is in parallel across said resistor of said integrator so as to discharge said capacitor at each period of the AC voltage, when said switch is conducting.

8. The circuit as claimed in claim 3, wherein, with the reference voltage, said comparator comprises a Zener diode or a diac whose characteristic voltage represents the desired output voltage.

9. The circuit as claimed in claim 8, wherein said integrator comprises a resistor in series with a capacitor the output signal of said integrator being formed by the voltage at the terminals of said capacitor and wherein said diode is connected between a plate of said capacitor of said integrator and the control electrode of said switch.

10. The circuit as claimed in claim 3, wherein said integrator comprises a resistor in series with a capacitor, the output signal of said integrator being formed by the voltage at the terminals of said capacitor and wherein said comparator comprises a doublt-base transistor whose emitter receives the voltage at the terminals of said capacitor of said integrator and whose base receives the instruction voltage.

11. The circuit as claimed in claim 3, wherein said integrator comprises a resistor in series with a capacitor, the output signal of said integrator being formed by the voltage at the terminals of said capacitor and wherein said comparator comprises a transistor one electrode of which receives the voltage at the terminals of said capacitor of said integrator and and another electrode receives the instruction signal.

12. The circuit as claimed in claim 4, wherein said integrator comprises a resistor in series with a capacitor, the output signal of said integrator beign formed by the voltage at the terminals of said capacitor and wherein there is further provided a transistor whose emitter-collector space is in parallel across said capacitor of said integrator and which is connected so as to be conducting when said control switch is itself conducting so as to discharge said capacitor at each period of the AC voltage.

13. The circuit as claimed in any one of the preceding claims, wherein said control switch comprises a thyristor in parallel with, but in opposite direction to, a diode.

14. The circuit as claimed in any claim 1, wherein there is further provided a nondissipating filtering means with inductance and capacitor, the output voltage being the voltage at the terminals of this capacitor.

15. The circuit as claimed in claim 1, wherein the AC voltage is a voltage at the horizontal-scan frequency in a television receiver.

16. The circuit as claimed in claim 15, wherein the AC voltage is the line return voltage.

17. The circuit as claimed in claim 15 or 16, wherein the output voltage is a DC voltage and supplies auxiliary circuits of a television receiver.

18. The circuit as claimed in claim 16, wherein the output voltage forms the supply voltage for the vertical-scan coil of a television receiver, the instruction signal being a substantially sawtooth signal at the vertical-scan frequency.

19. The circuit as claimed in claim 1, wherein the AC voltage is at zero mean value.

* * * * *